(12) United States Patent
Tauchi et al.

(10) Patent No.: US 11,984,880 B2
(45) Date of Patent: May 14, 2024

(54) UNBALANCED FAILURE DETECTOR CIRCUIT FOR DETECTING UNBALANCED FAILURE OF ELECTRONIC DEVICE APPARATUS INCLUDING ELECTRONIC DEVICES

(71) Applicant: OMRON Corporation, Kyoto (JP)

(72) Inventors: Hironori Tauchi, Kyoto (JP); Yuki Ito, Kyoto (JP); Takashi Hyodo, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 279 days.

(21) Appl. No.: 17/627,870

(22) PCT Filed: Aug. 7, 2019

(86) PCT No.: PCT/JP2019/031221
§ 371 (c)(1),
(2) Date: Jan. 18, 2022

(87) PCT Pub. No.: WO2021/024432
PCT Pub. Date: Feb. 11, 2021

(65) Prior Publication Data
US 2022/0294440 A1    Sep. 15, 2022

(51) Int. Cl.
*H03K 17/082* (2006.01)
(52) U.S. Cl.
CPC . *H03K 17/0822* (2013.01); *H03K 2217/0027* (2013.01)
(58) Field of Classification Search
CPC ....... H03K 17/0822; H03K 2217/0027; H03K 17/122

(Continued)

(56) References Cited

U.S. PATENT DOCUMENTS

| 10,284,095 B1 | 5/2019 | Mednik et al. |
| 2018/0123579 A1 | 5/2018 | Fink et al. |
| 2019/0225099 A1* | 7/2019 | Sieber ............... H02J 50/60 |

FOREIGN PATENT DOCUMENTS

| CN | 103973148 A | * 8/2014 | ............. H02J 3/381 |
| JP | H1042546 A | 2/1998 | |

(Continued)

OTHER PUBLICATIONS

Gu et al., "PCB Rogowski Coils for 300 kA Current Measurement on a Multi-Split Conductor," in IEEE Sensors Journal, vol. 19, No. 16, pp. 6786-6794, Aug. 15, 2019, doi: 10.1109/JSEN.2019.2914730 (Year: 2019).*

(Continued)

*Primary Examiner* — Tung X Nguyen
*Assistant Examiner* — Robert P Alejnikov, Jr.
(74) *Attorney, Agent, or Firm* — CANTOR COLBURN LLP

(57) ABSTRACT

An unbalanced failure detector circuit according to one aspect of the present disclosure is provided for detecting an unbalanced failure of an electronic device apparatus including electronic devices, and the electronic device apparatus includes a plurality of current paths connected in parallel. The unbalanced failure detector circuit includes a detector unit, and a controller. The detector unit has a plurality of coils connected in series and arranged to surround the plurality of current paths, respectively, and is configured to output a coil sum voltage which is a sum of induced voltages generated across the plurality of coils by currents flowing through the plurality of current paths. The controller is configured to detect the unbalanced failure of the electronic device apparatus when the coil sum voltage outputted from the detector unit exceeds a predetermined value range.

6 Claims, 6 Drawing Sheets

(58) Field of Classification Search
USPC .................................................. 324/762.09
See application file for complete search history.

(56) References Cited

FOREIGN PATENT DOCUMENTS

| | | |
|---|---|---|
| JP | 2005073215 A | 3/2005 |
| JP | 2015149828 A | 8/2015 |

OTHER PUBLICATIONS

EPO Extended European Search Report for corresponding EP Application No. 19940891.5; dated Mar. 20, 2023.
International Search Report for International Application No. PCT/JP2019/031221; dated Nov. 5, 2019.
PCT Written Opinion of the International Searching Authority for International Application No. PCT/JP2019/031221; dated Nov. 5, 2019.

* cited by examiner

UNBALANCED FAILURE DETECTOR CIRCUIT FOR DETECTING UNBALANCED FAILURE OF ELECTRONIC DEVICE APPARATUS INCLUDING ELECTRONIC DEVICES

CROSS REFERENCE TO RELATED APPLICATIONS

This is the U.S. national stage of application No. PCT/JP2019/031221, filed on Aug. 7, 2019. Priority is claimed and the disclosure of which is also incorporated herein by reference.

TECHNICAL FIELD

The present disclosure relates to an unbalanced failure detector circuit that detects an unbalanced failure of an electronic device apparatus including electronic devices such as semiconductor switching devices, and relates to the electronic device apparatus includes the unbalanced failure detector circuit.

BACKGROUND ART

Patent Document 1 is provided to have such an objective as providing an apparatus having a configuration in which a plurality of semiconductor switching devices connected in parallel are simultaneously operated by operation signals from a common drive circuit, to reliably detect occurrence of overcurrent in any of the semiconductor switching devices by a simple circuit.

In the Patent Document 1, when a plurality of (for example, two) insulated gate bipolar transistors (IGBTs) are arranged in parallel and a gate drive circuit applies a common drive signal to these IGBTs, a gate current detector is inserted into each wiring line between the gate drive circuit and each IGBT. When an overcurrent flows through any of the IGBTs, a polarity detector and an exclusive OR gate detect that the polarity of the detected current is different between the gate current detectors, and occurrence of the arm short-circuit current is detected. Alternatively, a circuit is added which detects that any of the detected currents between the two gate current detectors has exceeded the predetermined value by an overcurrent detector and an OR gate, and the logical product of the output of the OR gate and the output of the XOR gate is calculated by an AND gate to detect the occurrence of the arm short-circuit current.

PRIOR ART DOCUMENT

Patent Document

Patent Document 1: Japanese patent laid-open publication No. JPH10-042546A

SUMMARY OF THE INVENTION

Problems to be Solved by the Invention

The circuit of Patent Document 1 has a large number of components, and is difficult to miniaturize the size of the circuit.

The present disclosure discloses an unbalanced failure detector circuit for an electronic device apparatus, the unbalanced failure detector circuit being capable of detecting an unbalanced failure of an electronic device with a smaller number of components than that in the prior art.

Means for Solving the Problems

An unbalanced failure detector circuit according to one aspect of the present disclosure is provided for detecting an unbalanced failure of an electronic device apparatus including electronic devices, and the electronic device apparatus includes a plurality of current paths connected in parallel. The unbalanced failure detector circuit includes a detector unit, and a controller. The detector unit has a plurality of coils connected in series and arranged to surround the plurality of current paths, respectively, and is configured to output a coil sum voltage which is a sum of induced voltages generated across the plurality of coils by currents flowing through the plurality of current paths. The controller is configured to detect the unbalanced failure of the electronic device apparatus when the coil sum voltage outputted from the detector unit exceeds a predetermined value range.

Effect of the Invention

According to the unbalanced failure detector circuit for the present disclosure, the unbalanced failure can be detected with a smaller number of components than that in the prior art.

MODES FOR CARRYING OUT THE INVENTION

Figure 1:
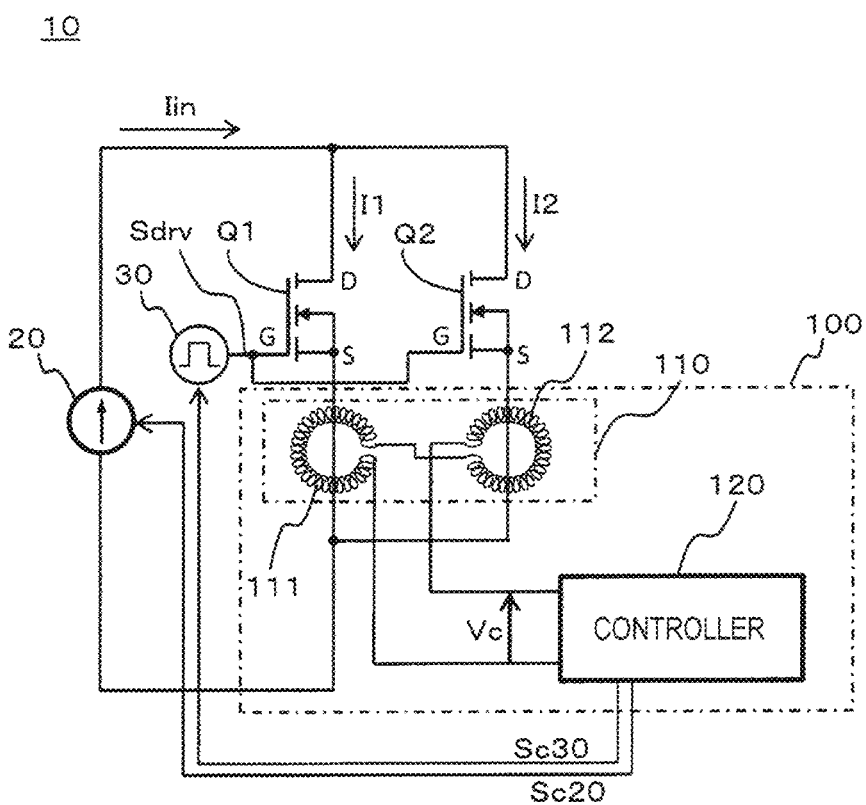
FIG. 1 is a block diagram illustrating a configuration example of a failure detector system 10 according to a first embodiment.

Hereinafter, embodiments according to the present invention are described with reference to the drawings. However, each of the embodiments described below is merely an example of the present invention in all respects. It goes without saying that various improvements and modifications can be made without departing from the scope of the present invention. That is, in implementing the present invention, a specific configuration according to the embodiment may be appropriately adopted. In addition, in the accompanying drawings, the same or similar constituents are denoted by the same reference characters.

First Embodiment

FIG. 1 is a block diagram illustrating a configuration example of a failure detector system 10 according to a first embodiment. Referring to FIG. 1, the failure detector system 10 is configured for an electronic device apparatus including two current paths into which switching devices Q1 and Q2 are inserted, respectively. The failure detector system 10 includes a direct current source 20, a drive signal oscillator 30, the switching devices Q1 and Q2 connected in parallel, and a failure detector circuit 100. The failure detector circuit 100 includes a detector unit 110 having two coils 111 and 112 connected in series, and a controller 120.

Referring to FIG. 1, the direct current source 20 is a power supply that outputs a direct input current Iin, and supplies electric power. The drive signal oscillator 30 controls the switching devices Q1 and Q2 to be turned on and off by the same drive signal Sdrv. The switching devices Q1 and Q2 are, for example, semiconductor switching devices such as metal oxide semiconductor field effect transistors (MOSFETs), and both of the switching devices Q1 and Q2 are controlled by the switching device drive signal Sdrv to switch over the conduction state. That is, currents I1 and I2, flowing through the current paths including the switching devices Q1 and Q2, respectively, become zero when the drive signal Sdrv has a low level, and become the largest when the drive signal Sdrv has a high level.

The coils 111 and 112 of the detector unit 110 are arranged to surround the vicinities of the two current paths, and generate induced voltages by the currents I1 and I2, respectively. The controller 120 detects a coil sum voltage Vc, which is the sum of the induced voltages across the coils 111 and 112, and detects that an unbalanced failure occurs in the electronic device apparatus when the value thereof is larger than a predetermined threshold Vth or smaller than −Vth. In this case, the unbalanced failure refers to a failure in which a current of a ratio deviating from a normal predetermined current ratio flows in a set of a plurality of current paths of the electronic device apparatus, and includes the following three failures.

(1) The first unbalanced failure in which the resistance value of any one of the switching devices Q1 and Q2 becomes different from the resistance value of the other and the currents I1 and I2 are not equal to each other.

(2) The second unbalanced failure in which a short-circuit failure occurs in any one of the switching devices Q1 and Q2, and among the currents I1 and I2, the current I1 or I2 flowing in the current path of the switching device Q1 or Q2 in which the short-circuit failure has occurred increases.

(3) The third unbalanced failure in which an open failure occurs in any one of the switching devices Q1 and Q2, and among the currents I1 and I2, the current I1 or I2 flowing through the current path of the switching device Q1 or Q2 that has not caused the open failure rapidly increases.

When detecting the unbalanced failure, the controller 120 outputs stop signals Sc20 and Sc30 to the direct current source 20 and the drive signal oscillator 30, respectively, to stop the operations of the direct current source 20 and the drive signal oscillator 30.

The operation of the failure detector system 10 configured as above is described below.

In the failure detector system 10 of FIG. 1, the coils 111 and 112 have the same number of windings and opposite winding directions to each other, and are arranged in the vicinity of the current paths of the currents flowing through the switching devices Q1 and Q2, respectively.

The induced voltages generated across the coils 111 and 112 by the currents I1 and I2 are proportional to slopes of the change in magnetic fluxes passing through the inside of the winding of the coils 111 and 112, respectively, and the magnetic fluxes generated by the currents I1 and I2 are proportional to the currents I1 and I2, respectively. Therefore, when the switching devices Q1 and Q2 operate normally, because the values of the currents I1 and I2 are always equal to each other, the induced voltages across the coils 111 and 112 are equal in magnitude to each other, and are opposite in direction to each other. Therefore, the two induced voltages cancel each other, and the value of the coil sum voltage Vc becomes zero.

Figure 2:
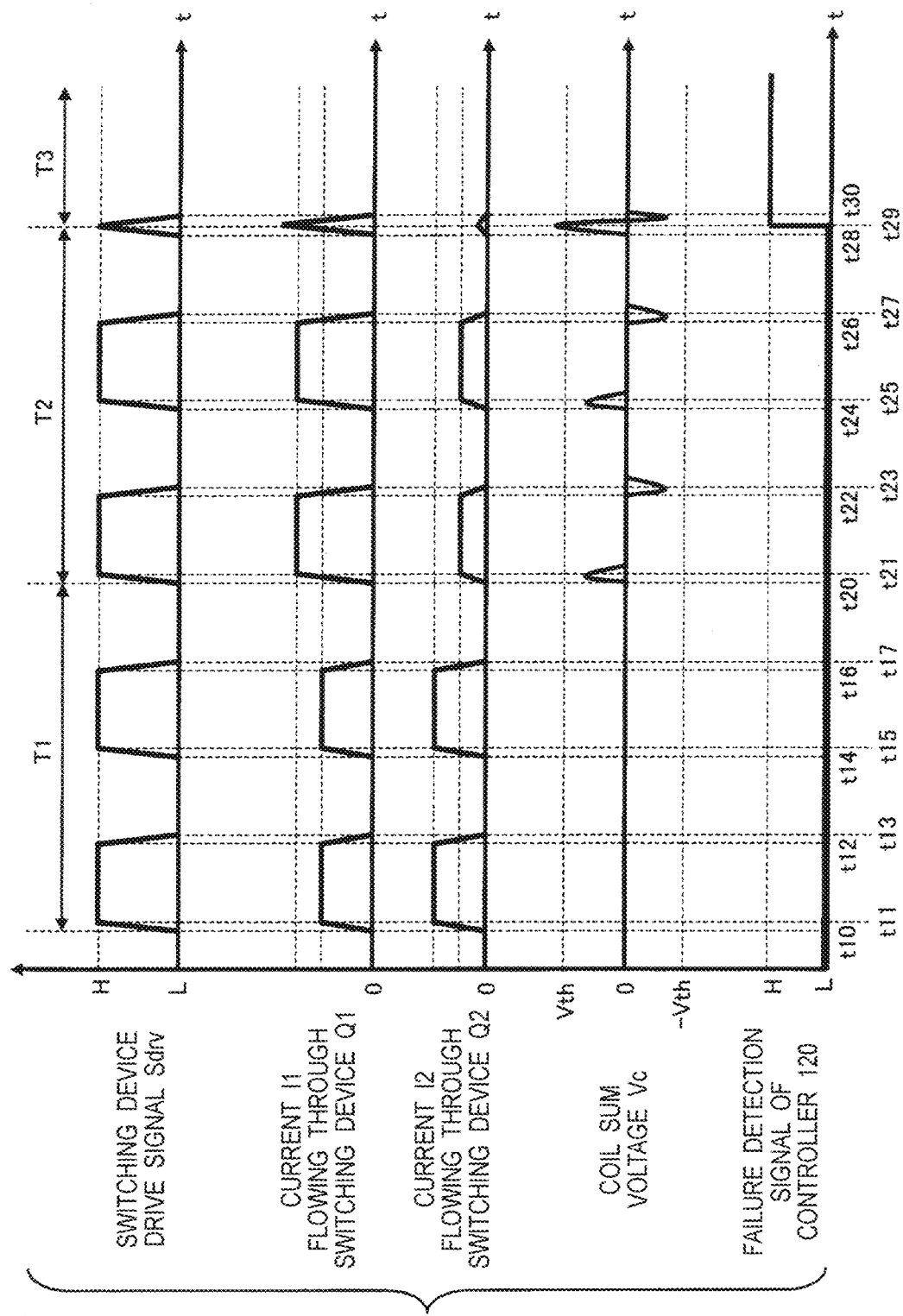
FIG. 2 is a timing chart illustrating an example of waveforms of signals or the like in respective units of the failure detector system 10 in FIG. 1.

FIG. 2 is a timing chart illustrating an example of waveforms of signals or the like in respective units of the failure detector system 10 in FIG. 1. In FIG. 2, times t10 to t29 indicate times of the switching operations of the failure detector system 10. The time interval between the times t10 and t20 is the time interval T1 of steady operation in which the currents I1 and I2 are equal to each other, the time interval between the times t20 and t29 is the time interval T2 of steady operation in which the currents I1 and I2 are not equal to each other, and the time interval after the time t29 is a stop time interval T3 in which the "first unbalanced failure" is detected and the operations of the switching devices Q1 and Q2 stop.

Referring to FIG. 2, in the times t10 to t11, the switching device drive signal Sdrv from the drive signal oscillator 30 rises, and the currents I1 and I2 start flowing through the switching devices Q1 and Q2. Because the switching devices Q1 and Q2 are controlled by the same switching device drive signal Sdrv, and the currents I1 and I2 increase with the same slope, the induced voltages generated across the coils 111 and 112 cancel each other, and the value of the coil sum voltage Vc becomes zero. At the time t11, the switching device drive signal Sdrv turns to the high level, and the currents I1 and I2 stop increasing.

In the times t11 to t12, because the currents I1 and I2 flowing through the switching devices Q1 and Q2 do not change, no induced voltage is generated across the coils 111 and 112, and then, the value of the coil sum voltage Vc is zero. In the times t12 to t13, the switching device drive signal Sdrv falls, and the currents I1 and I2 decrease. Although the induced voltages are generated across the coils 111 and 112 in directions opposite to the directions in the times t10 to t11, these induced voltages cancel each other, and the value of the coil sum voltage Vc becomes zero. In the times t13 to t14, because the switching device drive signal Sdrv has the low level and the switching devices Q1 and Q2 are in an insulated state, the currents I1 and I2 become zero, and the coil sum voltage Vc becomes zero. The times t14 to t17 are repetitions of the times t10 to t13. As described above, during the time interval T1, the coil sum voltage Vc is always at the zero level.

At the time t20, the control similar to that in the times t10 to t13 is started, but the "first unbalanced failure" occurs, and the current I1 becomes larger than the current I2. Due to the difference between the currents I1 and I2, the difference also occurs in the slopes of the change in the currents I1 and I2 in the times t20 to t21, and the slope of the current I1 becomes larger than the slope of the current I2. Therefore, the induced voltage generated across the coil 111 becomes larger than the induced voltage across the coil 112, and the coil sum voltage Vc has a positive value. However, because the difference between the slopes of the currents I1 and I2 is not so large as to cause the coil sum voltage Vc to exceed the threshold Vth, the controller 120 does not detect the unbalanced failure.

In the times t21 to t22, the values of the currents I1 and I2 remain constant, and the value of the coil sum voltage Vc is zero, in a manner similar to that of the times t11 to t12. In the times t22 to t23, the currents I1 and I2 decrease in a manner similar to that of the times t12 to t13, and the induced voltages are generated across the coils 111 and 112. Because the induced voltage across the coil 111 is larger than the induced voltage across the coil 112, the coil sum voltage Vc has a negative value (which is opposite to that in the case of the times t20 to t21). However, this value also does not fall below the threshold voltage −Vth, and the controller 120 does not detect the unbalanced failure. The times t24 to t27 are repetitions of the times t20 to t23. As described above, because the "first unbalanced failure" occurs during the time interval T2, the coil sum voltage Vc becomes the non-zero level at the rising and falling timings of the switching device drive signal Sdrv. However, the value of the coil sum voltage Vc always satisfies the equation of −Vth<Vc<Vth, and the controller 120 does not detect the first unbalanced failure.

At the time t28, the degree of the "first unbalanced failure" is deteriorated, and the difference between the slopes of the changes of the currents I1 and I2 becomes larger than the value at the time t20. In the times t28 to t29, the coil sum voltage Vc becomes larger than the value in the times t20 to t21, and exceeds the threshold Vth at the time t29. In response to the coil sum voltage Vc exceeding the threshold Vth, the controller 120 detects the "first unbalanced failure" and transmits the stop signal Sc30 to the drive signal oscillator 30. At a time t30, by the drive signal oscillator 30 stopping outputting the switching device drive signal Sdrv in response to the stop signal Sc30, the switching devices Q1 and Q2 are turned off and the operation of the failure detector system 10 stops. As described above, during the time interval T3, the degree of the "first unbalanced failure" is deteriorated, and the coil sum voltage Vc becomes smaller than −Vth or larger than Vth. In response to this, the controller 120 stops the output of the switching device drive signal Sdrv in the drive signal generation unit.

As described above, the failure detector system 10 detects the unbalanced failure in response to the fact that the difference is generated between the currents I1 and I2 due to the failure of the switching devices Q1 and Q2 and the coil sum voltage Vc exceeds a voltage value range of −Vth to Vth, and stops the operations of the switching devices Q1 and Q2.

Figure 3:
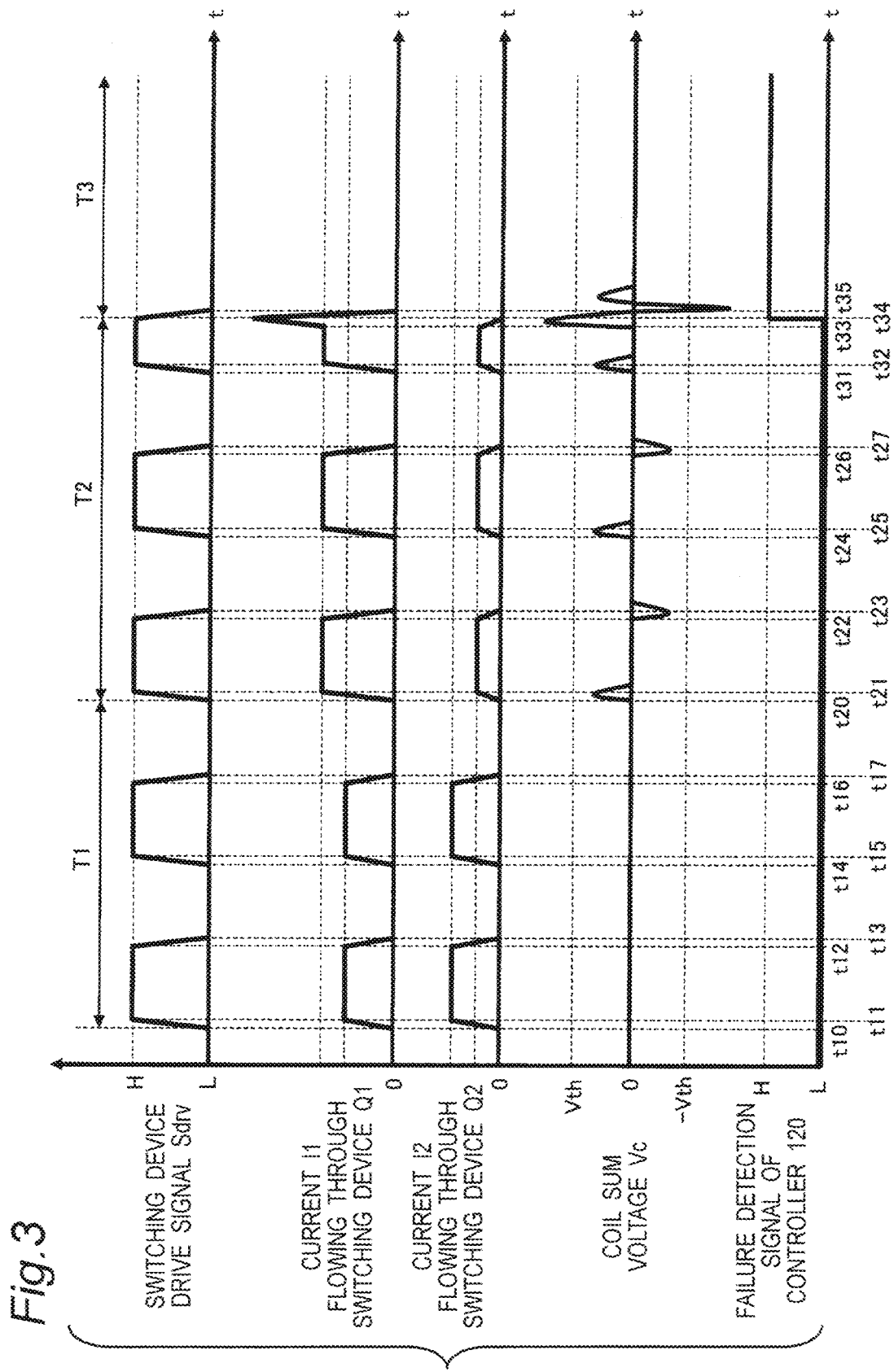
FIG. 3 is a timing chart illustrating another example of waveforms of signals or the like in respective units of the failure detector system 10 in FIG. 1.

FIG. 3 is a timing chart illustrating another example of waveforms of signals or the like in respective units of the failure detector system 10 in FIG. 1. The example of FIG. 3 is different from the example of FIG. 2 in that the deterioration of the "first unbalanced failure" during the time interval T2 occurs while the switching device drive signal Sdrv is turned on. Referring to FIG. 3, because the operation in the times t10 to t27 is similar to that in FIG. 2, the description thereof is omitted. The operation in times t31 to t32 is similar to that in the times t20 to t21, and the "first unbalanced failure" occurs during the time interval T2.

Referring to FIG. 3, at a time t33, the degree of the "first unbalanced failure" deteriorates, the current I1 starts to increase rapidly, and at the same time, the current I2 that has already been flowing starts to decrease. Therefore, a very large induced voltage is generated across the coil 111. On the other hand, the induced voltage in the direction opposite to the direction in the times t10 to t11 is generated across the coil 112. Because the direction of the current I2 is opposite to that during the time interval T1, the induced voltages across the two coils 111 and 112 are in the same direction, and do not cancel each other. As a result, the coil sum voltage Vc of the two coils 111 and 112 exceeds the threshold Vth at a time t34, and the controller 120 detects the "second unbalanced failure", stops the drive signal oscillator 30, and stops the switching devices Q1 and Q2 (in a manner similar to that of the time t29 in FIG. 2). As a result, the operation of the failure detector system 10 stops at a time t35 (in a manner similar to that of the time t30 in FIG. 2).

As described above, even when the switching device drive signal Sdrv has the high level, the failure detector system 10 detects the unbalanced failure in response to the coil sum voltage Vc exceeding the voltage value range of −Vth to Vth, and stops the switching device drive signal Sdrv inputted to the switching devices Q1 and Q2 to stop the operations of the switching devices Q1 and Q2. It is noted that the "third unbalanced failure" can be similarly detected and stopped.

Figure 4:
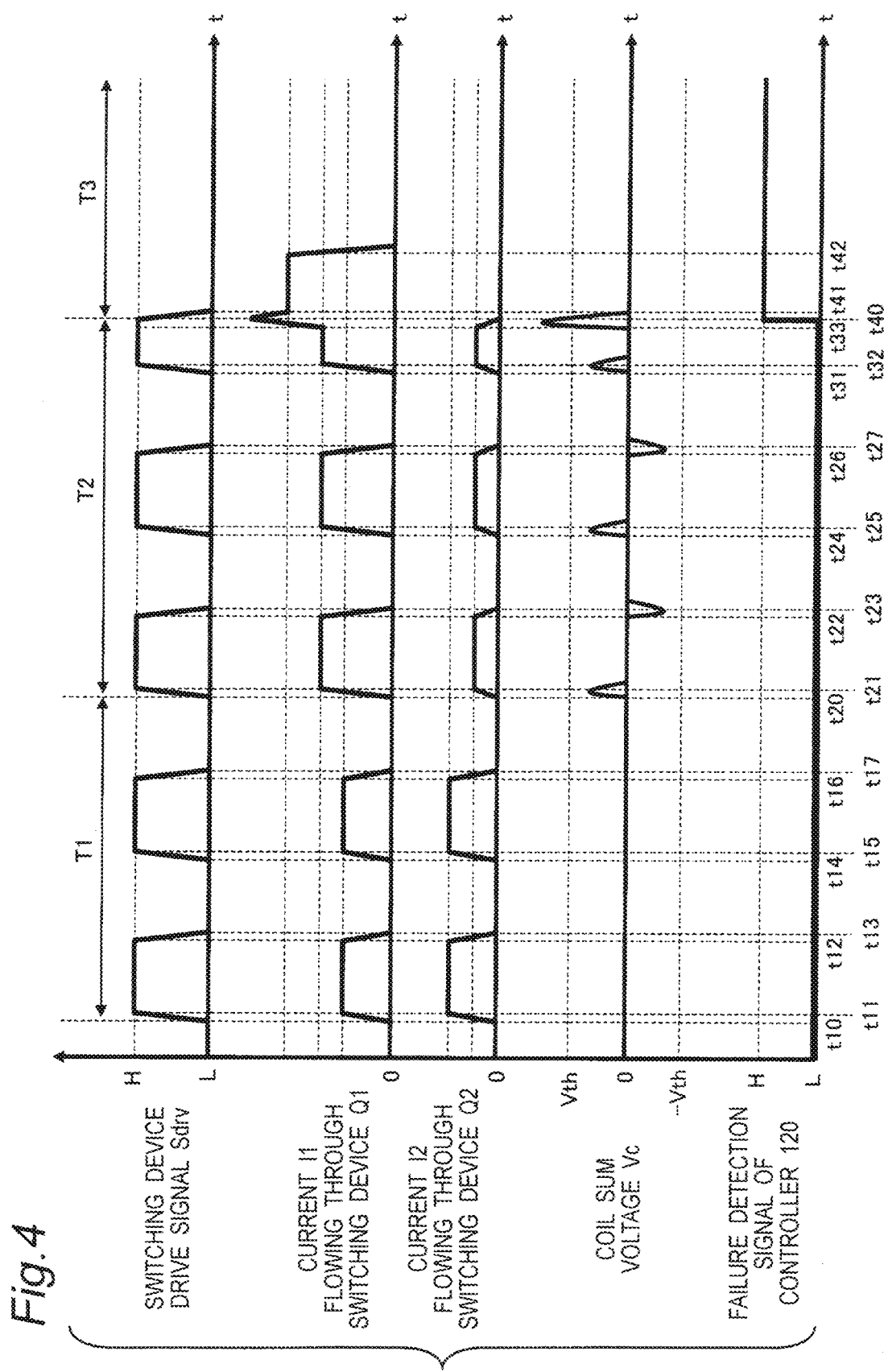
FIG. 4 is a timing chart illustrating yet another example of waveforms of signals or the like in respective units of the failure detector system 10 in FIG. 1.

FIG. 4 is a timing chart illustrating yet another example of waveforms of signals or the like in respective units of the failure detector system 10 in FIG. 1. The example of FIG. 4 is different from the example of FIG. 3 in that a short-circuit failure occurs in the switching device Q1 and the short-circuit state is maintained even if the switching device drive signal Sdrv stops. In FIG. 4, because the operation in the times t10 to t32 is similar to that in FIG. 3, the description thereof is omitted.

Referring to FIG. 4, at a time t40, the controller 120 detects that the value of the coil sum voltage Vc exceeds the voltage value range of −Vth to Vth, and outputs the stop signals Sc20 and Sc30 to the direct current source 20 and the drive signal oscillator 30. As a result, the switching device Q2 stops, but the short-circuit state of switching device Q1 is maintained. Therefore, the switching device Q1 does not stop as in the time t34 in FIG. 3, and the current I1 remains flowing. Thereafter, at a time t42, the direct current source 20 receives the stop signal Sc20, sets the input current Iin to zero, and stops the current flowing through the switching device Q1 having the short circuit failure.

As described above, the failure detector circuit 100 according to the first embodiment is, for example, the unbalanced failure detector circuit for the electronic device apparatus including the plurality of current paths into which electronic devices such as the switching devices Q1 and Q2 are inserted, respectively. The failure detector circuit 100 includes the detector unit 10 and the controller 120. The detector unit 110 is configured to make the sum voltage Vc of the induced voltages across the coils 111 and 112 become substantially zero when the switching devices Q1 and Q2 operate normally. The controller 120 is configured to detect the unbalanced failure of the electronic device apparatus when the sum voltage Vc of the induced voltages across the coils 111 and 112 exceeds the range from zero to values separated therefrom by a predetermined width (threshold Vth) in positive and negative directions. When detecting the unbalanced failure of the electronic device apparatus due to the open failure, the short circuit failure, or the like of the switching devices Q1 and Q2, the controller 120 stops the direct current source 20 and the drive signal oscillator 30 to stop the currents I1 and I2 flowing through the switching devices Q1 and Q2. Because the detector unit 110 includes only two coils 111 and 112 and the value detected by the controller 120 is only the coil sum voltage Vc, the failure detector system 10 can detect the unbalanced failure with a configuration having a small number of components.

Figure 5:
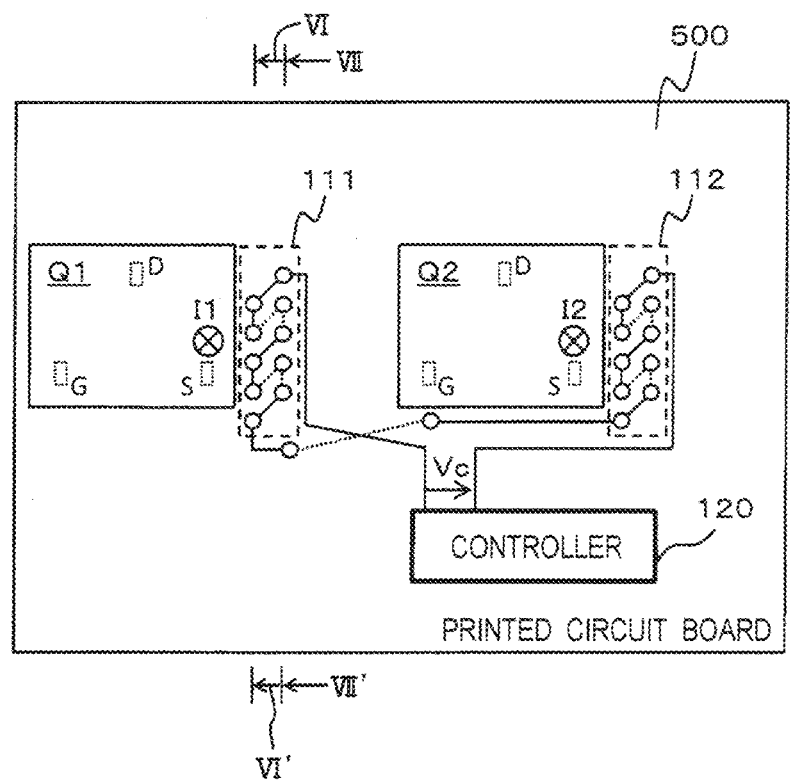
FIG. 5 is a top view illustrating a mounting example of the failure detector system 10 in FIG. 1 on a printed circuit board 500.
Figure 6:
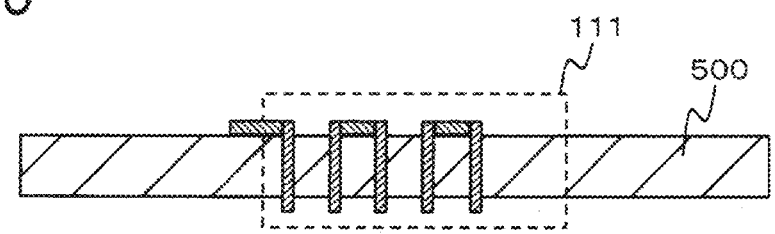
FIG. 6 is a cross-sectional view of the printed circuit board 500 in FIG. 5 taken along a broken line VI-VI'.
Figure 7:
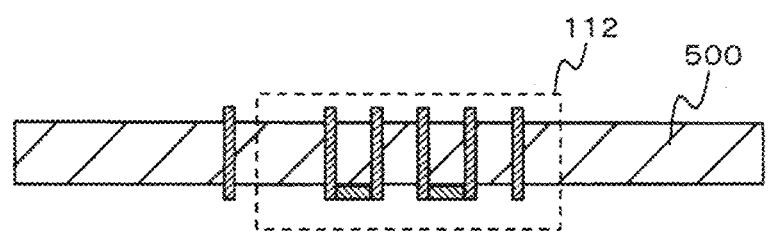
FIG. 7 is a cross-sectional view of the printed circuit board 500 in FIG. 5 taken along a broken line VII-VII'.

FIG. 5 is a top view illustrating a mounting example of the failure detector system 10 of FIG. 1 on a printed circuit board 500. In addition, FIG. 6 is a cross-sectional view of the printed circuit board 500 in FIG. 5 taken along a plane passing through VI-VI', and FIG. 7 is a cross-sectional view of the printed circuit board 500 in FIG. 5 taken along a plane passing through VII-VII'. In FIGS. 5 to 7, the configuration of the failure detector system 10 is similar to that of the failure detector system 10 in FIG. 1, but the direct current source 20, the drive signal oscillator 30, and some of the wiring lines are omitted for simplifying the drawing.

In the wiring lines of the circuit including the coils 111 and 112 and the controller 120 in FIG. 5, solid lines indicate conductive wires on the upper surface (front surface) of the printed circuit board 500, and dotted lines indicate conductive wires on the lower surface (back surface) of the printed circuit board 500. In addition, small circles included in the coils 111 and 112 indicate conductive wires that penetrates the printed circuit board 500 and conduct to both the upper and lower surfaces. The currents I1 and I2 flowing toward the back of the drawing flow through source terminals (S in FIG. 5) of the switching devices Q1 and Q2, respectively.

By wiring the upper and lower surfaces of the printed circuit board 500 in this manner, the conductive wires on the printed circuit board 500 configure the coils 111 and 112 having a spiral shape. The coils 111 and 112 connected in series in opposite directions to each other generate the induced voltages by the currents I1 and I2 flowing through the source terminals of the switching devices Q1 and Q2, respectively, and the controller 120 detects the coil sum voltage Vc.

Second Embodiment

Figure 8:
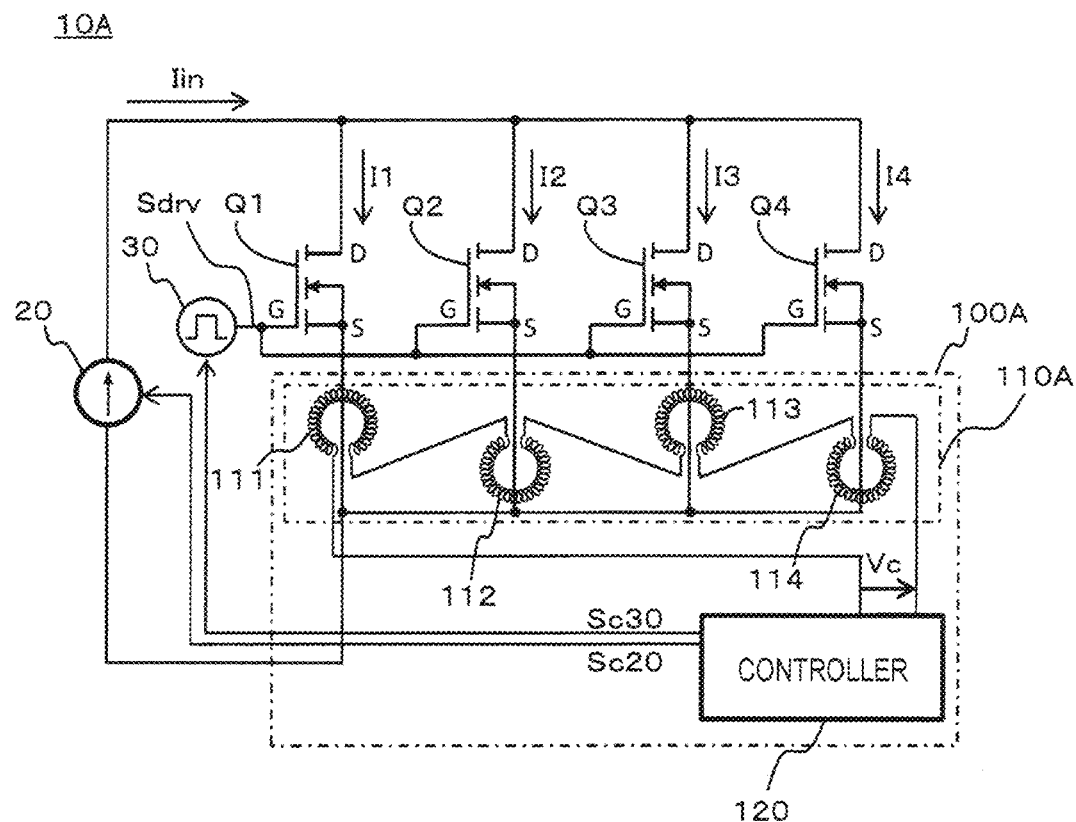
FIG. 8 is a block diagram illustrating a configuration example of a failure detector system 10A according to a second embodiment.

FIG. 8 is a block diagram illustrating a configuration example of a failure detector system 10A according to a second embodiment. Referring to FIG. 8, the failure detector system 10A is different from the failure detector system 10 in FIG. 1 in the following points:

(1) Switching devices Q3 and Q4 connected in parallel with a switching device Q1 are further included.

(2) A failure detector circuit 100A includes, instead of the detector unit 110, a detector unit 110A further including coils 113 and 114 connected in series to coils 111 and 112. The coils 113 and 114 are arranged in the vicinity of current paths passing through the switching devices Q3 and Q4, respectively, and have the same number of windings and opposite winding directions to each other.

Referring to FIG. 8, for example, when the open failure occurs only in the switching device Q4 and a current I4 becomes zero, the currents I1 to I3 flowing through the other switching devices Q1 to Q3 uniformly increase. As a result, the induced voltages generated across the coils 111 to 113 increase, and the induced voltage generated across the coil 114 decreases. As a result, the coil sum voltage Vc greatly increases and exceeds a threshold Vth in a manner similar to that of the time t30 in FIG. 3. The controller 120 detects an unbalanced failure when the coil sum voltage exceeds the threshold Vth.

It is noted that the number of current paths along which the failure detector system 10A in FIG. 8 detects the failure is not limited to two or four, and may be any number that can be expressed as (2×n) with respect to the natural number n. At that time, the detector unit 110A includes n sets of two coils connected in series and having the same number of windings and opposite winding directions to each other.

Other Embodiments

The first and second embodiments disclose the failure detector systems 10 and 10A that determine whether or not all currents flowing through even number of current paths are equal to each other. However, the number of current paths of a failure detector system may be an odd number, and currents flowing through the respective current paths may have different values during the time interval T1 of steady operation. For example, the case is considered where the currents $I_1$ to $I_N$ are made to flow in N current paths including a plurality of N switching devices Q1 to QN during the time interval T1. In this case, by arranging a plurality of N coils (for example, 111 and 112 in FIGS. 1; 111 to 114 in FIG. 8) in which the coil sum voltage Vc is zero with respect to the currents $I_1$ to $I_N$ so as to surround the vicinities of the N current paths, the unbalanced failure can be detected. Specifically, when the winding direction of the first coil that detects the current I1 is set as a reference and the number of windings of each of coils having the winding direction opposite to the reference direction is treated as a negative value, the total value of the products of the current value flowing through each current path and the number of windings of the coil surrounding the current path for all the current paths may be set to zero. That is, by making the following equation be satisfied, the coil sum voltage Vc becomes zero:

$$\sum_{i=1}^{N} I_i \times n_i = 0,$$

where $n_i$ (i=1, 2, . . . , N) denotes the number of windings of each of coils arranged to surround the i-th current path through which the current flows, and the number of windings is set to a negative value when the winding direction is opposite to that of the first coil as described above. However, in the case where the numbers of windings of the plurality of coils are different from each other, because the amount of change of the coil sum voltage Vc is different or changes depending on which of the switching devices Q1 to QN has a failure, the threshold Vth needs to be set carefully.

Further, in the first and second embodiments, the coil sum voltage Vc is assumed to become zero during the time interval T1 of steady operation in which all the switching devices normally operate. Therefore, the controller 120 detects the unbalanced failure when the coil sum voltage Vc exceeds the voltage value range of −Vth to Vth. However, for example, when the switching devices Q1 to Q4 are individually controlled, or when the numbers of windings $n_1$ to $n_4$ of the coils are not inversely proportional to ratio values of the currents $I_1$ to $I_4$, the coil sum voltage Vc can be set not to be zero even during the time interval T1. In this case, the controller 120 may be configured to detect the unbalanced failure by measuring an upper limit value and a lower limit value of the coil sum voltage Vc during the time interval T1 and when the range from the upper limit value to the lower limit value exceeds a predetermined value range.

In the first embodiment, the example of surface mounting on the upper and lower surfaces of the printed circuit board as shown in FIG. 5 has been described. However, a discrete semiconductor device (a semiconductor device achieving only a predetermined function) can be mounted, which is a semiconductor in which a plurality of switching devices and a plurality of coils are embedded in a substrate at the time of manufacturing and an operation similar to the above-described surface mounting is performed. In addition, in the unbalanced failure detector circuits of the first and second embodiments, the unbalanced failure in the direct current circuit using the direct current source 20 is detected. However, the unbalanced failure detector circuit of the present disclosure can also detect an unbalanced failure of the current in the alternating-current circuit.

INDUSTRIAL APPLICABILITY

The unbalanced failure detector circuit of the present disclosure is applicable to an electronic device apparatus including a plurality of current paths connected in parallel, into each of which an electronic device is inserted.

DESCRIPTION OF REFERENCE CHARACTERS

The invention claimed is:

1. An unbalanced failure detector circuit for detecting an unbalanced failure of an electronic device apparatus including electronic devices, and the electronic device apparatus including a plurality of current paths connected in parallel, the unbalanced failure detector circuit comprising:
   a detector unit having a plurality of coils connected in series and arranged to surround the plurality of current paths, respectively, and the detector unit being configured to output a coil sum voltage which is a sum of induced voltages generated across the plurality of coils by currents flowing through the plurality of current paths; and
   a controller configured to detect the unbalanced failure of the electronic device apparatus when the coil sum voltage outputted from the detector unit exceeds a predetermined value range.

2. The unbalanced failure detector circuit as claimed in claim 1,
   wherein each of the plurality of coils has a number of windings and a winding direction that cause the coil sum voltage to be substantially zero, and
   wherein the predetermined value range is a range between a positive threshold voltage and a negative threshold voltage.

3. The unbalanced failure detector circuit as claimed in claim 2,
   wherein the number of windings of each of the plurality of coils is set to satisfy the following equation:

$$\sum_{i=1}^{N} I_i \times n_i = 0,$$

where $I_i$ denotes a current flowing through each of the current paths,
$n_i$ denotes a number of windings of each of the coils corresponding to each of the current paths, and
a winding direction of one of the plurality of coils is defined as a reference winding direction,
a number of windings of each of coils having the winding direction that is identical to the reference winding direction is expressed by a positive number of windings, and
a number of windings of each of coils having the winding direction opposite to the reference winding direction is expressed by a negative number of windings.

4. The unbalanced failure detector circuit as claimed in claim 1,
   wherein the electronic device apparatus is powered by a power supply, and
   wherein the controller stops the power supply when the unbalanced failure is detected.

5. The unbalanced failure detector circuit as claimed in claim 1,
   wherein the plurality of electronic devices are semiconductor switching devices, respectively,
   wherein the plurality of semiconductor switching devices are controlled by an identical drive signal to selectively switch over conduction and non-conduction of currents, and
   wherein the unbalanced failure occurs due to a short-circuit failure or an open failure of at least one of the plurality of semiconductor switching devices.

6. An electronic device apparatus comprising:
   a plurality of current paths connected in parallel, each of the current paths including a semiconductor switching device; and
   an unbalanced failure detector circuit,
   wherein the unbalanced failure detector circuit is configured to detect an unbalanced failure of an electronic device apparatus including electronic devices, and the electronic device apparatus including a plurality of current paths connected in parallel, and
   wherein the unbalanced failure detector circuit comprises:
   a detector unit having a plurality of coils connected in series and arranged to surround the plurality of current paths, respectively, and the detector unit being configured to output a coil sum voltage which is a sum of induced voltages generated across the plurality of coils by currents flowing through the plurality of current paths; and
   a controller configured to detect the unbalanced failure of the electronic device apparatus when the coil sum voltage outputted from the detector unit exceeds a predetermined value range.

* * * * *